(12) United States Patent
Olzak

(10) Patent No.: US 7,353,092 B2
(45) Date of Patent: Apr. 1, 2008

(54) SUPPORT BRIDGE FOR FLEXIBLE CIRCUITRY

(75) Inventor: Richard A. Olzak, Kirkland, WA (US)

(73) Assignee: Honeywell International, Inc., Morristown, NJ (US)

( * ) Notice: Subject to any disclaimer, the term of this patent is extended or adjusted under 35 U.S.C. 154(b) by 143 days.

(21) Appl. No.: 11/016,574

(22) Filed: Dec. 17, 2004

(65) Prior Publication Data
US 2007/0100516 A1    May 3, 2007

(51) Int. Cl.
H01L 27/30    (2006.01)
(52) U.S. Cl. ........................................ 701/14; 455/3.02
(58) Field of Classification Search .................. 701/14, 701/13, 35, 15, 16; 342/357.13, 356, 455, 342/357.01; 455/3.02, 12.1, 13.1, 13.2; 244/17.13
See application file for complete search history.

(56) References Cited

U.S. PATENT DOCUMENTS

| 4,600,449 | A | * | 7/1986 | White et al. ................. 148/407 |
| 4,604,711 | A | * | 8/1986 | Benn et al. .................... 701/14 |
| 4,644,494 | A | * | 2/1987 | Muller ......................... 711/152 |
| 4,646,241 | A | * | 2/1987 | Ratchford et al. ............. 701/14 |
| 5,508,922 | A |   | 4/1996 | Clavelloux et al. |
| 5,859,765 | A | * | 1/1999 | Grewe ......................... 361/724 |
| 6,147,928 | A |   | 11/2000 | Onizuka et al. |
| 6,268,787 | B1 |  | 7/2001 | Onizuka |
| 2004/0075175 | A1 | * | 4/2004 | Koenck ....................... 257/773 |

FOREIGN PATENT DOCUMENTS

| JP | 2003332136 | 11/2003 |
| WO | 9535589 | 12/1995 |

* cited by examiner

Primary Examiner—Dalena Tran
(74) Attorney, Agent, or Firm—Ingrassia Fisher & Lorenz

(57) ABSTRACT

A flight data recorder having a crash survivable memory unit, a processing unit, a data transmit device and a support device for supporting the data transmit device. The support device includes an electromagnetic interference reduction device that surrounds the data transmit device. The support device is coupled to the crash survivable memory unit or the processing unit for supporting the electromagnetic interference reduction device.

20 Claims, 2 Drawing Sheets

SUPPORT BRIDGE FOR FLEXIBLE CIRCUITRY

BACKGROUND

A flight data recorder used on military helicopter includes an exposed flexible circuit portion. The exposed flexible circuit portion emits an unacceptably high level of electromagnetic radiation. In order to reduce the emission of electromagnetic radiation, ferrite core is applied to surround flexible circuit and to attenuate the emission. However, in the high vibration environment of a helicopter, the combination of the ferrite core and the flexible circuit deteriorates and results in premature failure.

Therefore, there exists a need for a mechanism for stemming the life of a flexible circuit used in data recorders for helicopters.

BRIEF DESCRIPTION OF THE DRAWINGS

The preferred and alternative embodiments of the present invention are described in detail below with reference to the following drawings.

DETAILED DESCRIPTION

Figure 1:
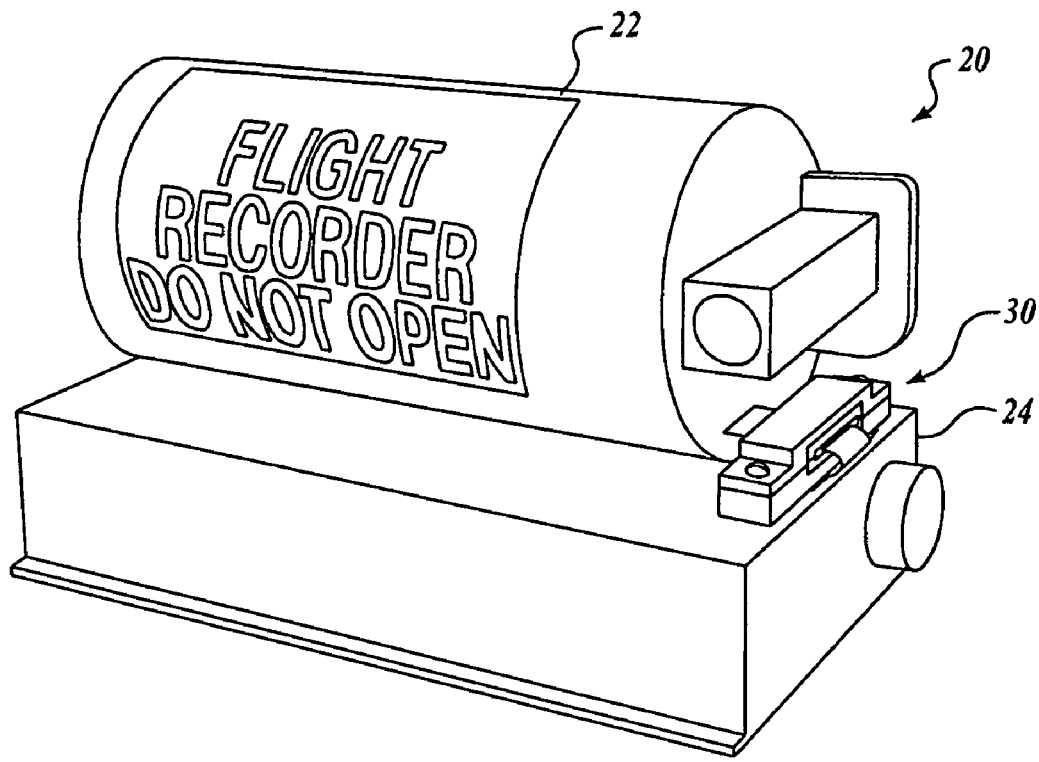
FIG. 1 is a perspective view of a flight data recorder formed in accordance with an embodiment of the present invention.

FIG. 1 illustrates a perspective view of a flight data recorder 20 formed in accordance with an embodiment of the present invention. The flight data recorder 20 includes a crash-survivable memory unit 22 and a processing unit 24. The flight data recorder 20 also includes a data transfer and support device 30, which will be described in more detail below.

Figure 2:
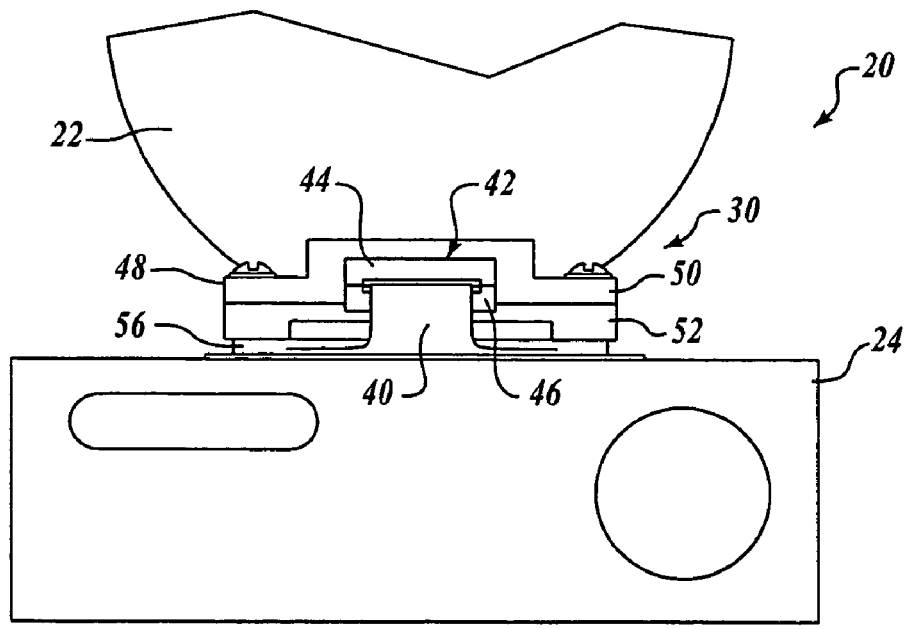
FIG. 2 is a partial front view of the flight data recorder shown in FIG. 1.
Figure 3:
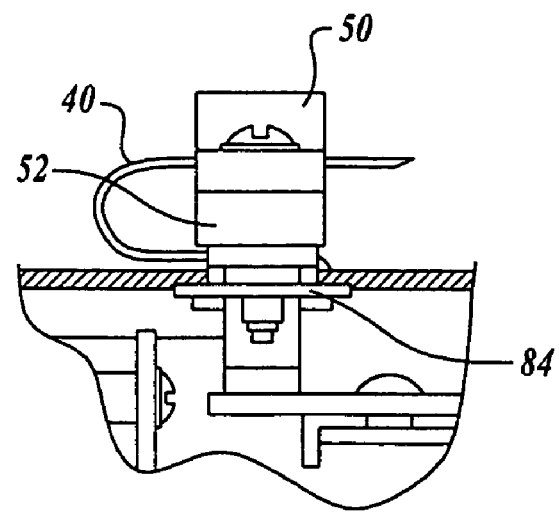
FIG. 3 illustrates a partial x-ray side view of the flight data recorder shown in FIG. 1.

FIG. 2 illustrates a partial side view of the flight data recorder 20. The data transfer and support device 30 includes a flexprint circuit 40 that is connected to internal circuitry of the processing unit 24 and memory storage devices within the crash-survivable memory unit 22. In this embodiment, the data transfer and support device 30 includes a ferrite core 42 and a support bridge 48 and a flexprint circuit connector 56. The ferrite core 42 includes first and second sections 44 and 46. The support bridge 48 includes first and second sections 50 and 52 The flexprint circuit connector 56 connects the flexprint circuit 40 to the internal circuitry of the processing unit 24. FIG. 3 shows the flexprint circuit connector 56 connected to components within the processing unit 24.

Figure 4:
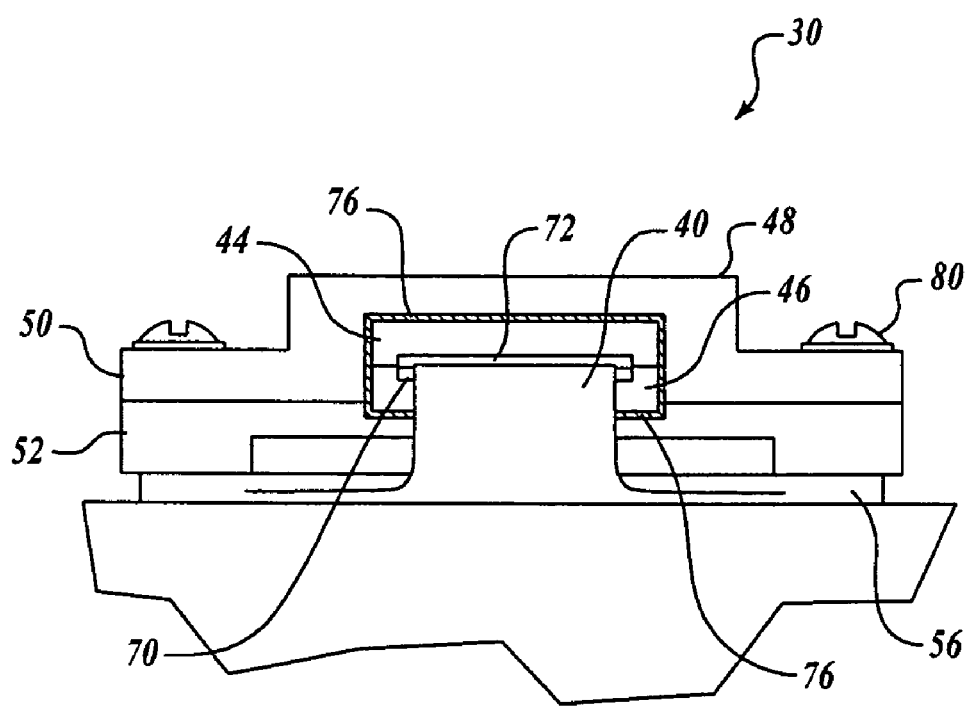
FIG. 4 illustrates a front view of a component of the flight data recorder.

As shown in FIG. 4, the first and second sections of the ferrite core 44 and 46 attach at ends to form a complete ring around the flexprint circuit 40. Isolator pads 70 and 72 are positioned between the ferrite core sections 44 and 46 and the flexprint circuit 40. Example isolator pads 70 and 72 are silicon cushions, such as those produced by Nott Atwater Company (e.g., mil. spec. no. 600-6108-002). In one embodiment, the isolator pads 70 and 72 include an adhesive on one side for attaching to respective inside surfaces of the ferrite core sections 44 and 46.

The first and second sections 50 and 52 of the support bridge 48 combine to form a ring that securely holds the ferrite core sections 44 and 46. Adhesive 76 is applied between the ferrite core sections 44 and 46 and inner surfaces of the support bridge sections 50 and 52. The Adhesive 76 ensures that the ferrite core sections 44 and 46 are securely held within the support bridge sections 50 and 52. Attachment devices 80, such as screws, bolts, rivets or other securing devices are applied through cavities at ends of the support bridge sections 50 and 52 and through cavities at ends of the flexprint connector 56 and are received by a receiving device 84 (FIG. 3) located within the processing unit 24, thereby causing the sections of the support bridge sections 50 and 52 and the flexprint circuit connector 56 to be held securely against the surface of the processing unit 24. In one embodiment, the receiving device 84 is a nut plate.

The support bridge 48 is positioned in order to locate the ferrite core 42 to receive the flexprint circuit 30 such that the flexprint circuit 30 is received by the flexprint circuit connector 56 and by a receiving cavity (not shown) of the crash-survivable memory unit 22 without any undue bending. The support bridge 48 is positioned to greatly reduce the amount of vibration experienced by the flexprint circuit 30.

In one embodiment, the support bridge sections 50 and 52 are formed of plastic, such as Delrin, an easily machined vibration damping plastic that is stable over a wide range of temperatures, or comparable lightweight durable low wear, low friction material. In one embodiment, the adhesive 76 is a double-sided tape, such as that produced by 3M.

When the data transmit and support device 30 is fully formed and secured to the processing unit 24, the ferrite core sections 44 and 46 are securely held together thereby presenting a contiguous ferrite core surface around the flexprint circuit 40, thus reducing electromagnetic interference of data transmitted from processing unit 24 to the crash-survivable memory unit 22 over the flexprint circuit 40.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The invention claimed is:

1. A flight data recorder comprising:
   a crash survivable memory unit;
   a processing unit located proximate the crash survivable memory unit; and
   a data transmit and support device coupled to the processing unit, the device comprising:
      a flexprint circuit;
      an electromagnetic interference reduction device surrounding a portion of the flexprint circuit; and
      a support device coupled to at least one of the crash survivable memory unit or the processing unit for supporting the electromagnetic interference reduction device and the flexprint circuit.

2. The recorder of claim 1, wherein the electromagnetic interference device includes a ferrite core having two sections.

3. The recorder of claim 1, further comprising a cushion positioned between the flexprint circuit and the electromagnetic interference reduction device.

4. The recorder of claim 3, wherein the cushion includes a silicon rubber material.

5. The recorder of claim 1, further comprising an adhesive bonding the electromagnetic interference device to the support device.

6. The recorder of claim 5, wherein the adhesive includes a double-sided tape.

7. The recorder of claim 1, wherein the support device includes plastic.

8. The recorder of claim 7, wherein the plastic includes Delrin.

9. The recorder of claim 7, wherein the plastic includes a vibration damping plastic.

10. A flight data recorder comprising:
a crash survivable memory unit;
a processing unit located proximate the crash survivable memory unit;
a data transmit device coupled to components within the processing unit and the crash survivable memory unit for transmitting data between the processing unit and the crash survivable memory unit; and
a support device for supporting the data transmit device, the device comprising:
an electromagnetic interference reduction device surrounding a portion of the data transmit device; and
the support device coupled to at least one of the crash survivable memory unit or the processing unit for supporting the electromagnetic interference reduction device.

11. The recorder of claim 10, wherein the data transmit device includes a flexprint circuit.

12. The recorder of claim 11, wherein the electromagnetic interference reduction device includes a ferrite core having two sections.

13. The recorder of claim 11, further comprising a cushion positioned between the flexprint circuit and the electromagnetic interference reduction device.

14. The recorder of claim 13, wherein the cushion includes a silicon rubber material.

15. The recorder of claim 11, further comprising an adhesive bonding the electromagnetic interference reduction device to the support device.

16. The recorder of claim 15, wherein the adhesive includes a double-sided tape.

17. The recorder of claim 11, wherein the support device includes plastic.

18. The recorder of claim 17, wherein the plastic includes Delrin.

19. The recorder of claim 17, wherein the plastic includes a vibration damping plastic.

20. A flight data recorder comprising:
a crash survivable memory unit;
a processing unit located proximate the crash survivable memory unit;
a flexprint circuit coupled to components within the processing unit and the crash survivable memory unit for transmitting data between the processing unit and the crash survivable memory unit; and
a support device for supporting the flexprint circuit, the device comprising:
a ferrite core having two sections surrounding a portion of the flexprint circuit; and
the support device coupled to at least one of the crash survivable memory unit or the processing unit for supporting the electromagnetic interference reduction device.

* * * * *